United States Patent
Cho et al.

(10) Patent No.: US 7,507,652 B2
(45) Date of Patent: Mar. 24, 2009

(54) METHODS OF FORMING A COMPOSITE DIELECTRIC STRUCTURE AND METHODS OF MANUFACTURING A SEMICONDUCTOR DEVICE INCLUDING A COMPOSITE DIELECTRIC STRUCTURE

(75) Inventors: Hag-Ju Cho, Seoul (KR); Yu-Gyun Shin, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 428 days.

(21) Appl. No.: 11/176,715

(22) Filed: Jul. 7, 2005

(65) Prior Publication Data
US 2006/0009043 A1 Jan. 12, 2006

(30) Foreign Application Priority Data
Jul. 10, 2004 (KR) ...................... 10-2004-0053752

(51) Int. Cl.
*H01L 21/3205* (2006.01)
*H01L 21/4763* (2006.01)

(52) U.S. Cl. ................. 438/591; 438/216; 438/261; 438/287; 438/786; 257/E21.302

(58) Field of Classification Search ........... 438/216, 438/240, 261, 287, 591, 785, 786; 257/E21.302
See application file for complete search history.

(56) References Cited

U.S. PATENT DOCUMENTS

| 6,642,131 B2 | 11/2003 | Harada |
| 6,828,200 B2 * | 12/2004 | Chambers et al. ........... 438/287 |
| 2003/0049942 A1 * | 3/2003 | Haukka et al. ............ 438/778 |

FOREIGN PATENT DOCUMENTS

| JP | 2003-00801 | 1/2003 |
| KR | 1020020033037 A | 5/2002 |
| KR | 1020030002298 A | 1/2003 |
| KR | 1020040023528 A | 3/2004 |

* cited by examiner

*Primary Examiner*—Thanhha Pham
(74) *Attorney, Agent, or Firm*—Myers Bigel Sibley & Sajovec, P.A.

(57) ABSTRACT

Some methods that are provided form a composite dielectric structure on a substrate. A first dielectric layer that includes metal and oxygen is formed on a substrate. A preliminary dielectric layer that includes silicon is formed on the first dielectric layer. A plasma nitriding treatment is performed on the preliminary dielectric layer to change it into a second dielectric layer. The composite dielectric structure includes the second dielectric layer and the first dielectric layer. Other methods form a semiconductor device that includes the composite dielectric structure.

31 Claims, 7 Drawing Sheets

METHODS OF FORMING A COMPOSITE DIELECTRIC STRUCTURE AND METHODS OF MANUFACTURING A SEMICONDUCTOR DEVICE INCLUDING A COMPOSITE DIELECTRIC STRUCTURE

CROSS REFERENCE TO RELATED APPLICATION

This application claims priority under 35 USC § 119 to Korean Patent Application No. 2004-53752 filed on Jul. 10, 2004, the contents of which are incorporated herein by reference in its entirety.

FIELD OF THE INVENTION

The present invention relates to semiconductor devices and, more particularly, to methods of forming a composite dielectric structure and related methods of manufacturing a semiconductor device.

BACKGROUND OF THE INVENTION

Semiconductor memory devices have become more highly integrated and operate at higher speeds by significantly reducing the size of memory cells in the devices. Reduced memory cell size has correspondingly reduced the area available for forming transistors and capacitors therein. Accordingly, transistor gate electrode lengths have been decreased.

Decreased transistor gate electrode length can cause a corresponding decrease in the thickness of a gate insulation layer beneath the gate electrode. When the gate insulation layer is formed from silicon oxide ($SiO_2$) and has a thickness of less than about 20 Å, the operation of the transistor may be degraded by an increase in its leakage current due to electron tunneling, infiltration of impurities in the gate electrode, and/or decrease of its threshold voltage.

Capacitor capacitance in the memory cell can decrease as the memory cell decreases in size. Reduction of the capacitance may cause the operation of the memory cell to be degraded by deterioration of data readability in the memory cell, increase in soft error rate, and/or unstable performance of the memory device when operated with a relatively low voltage.

One area of research is directed to developing memory cells with a dielectric layer that has a high dielectric constant. In such memory cells, the gate insulation layer or dielectric layer includes a material having a high dielectric constant, such as tantalum oxide ($Ta_2O_5$), yttrium oxide ($Y_2O_3$), lanthanum oxide ($La_2O_3$), hafnium oxide ($HfO_2$), zirconium oxide ($ZrO_2$), niobium oxide ($Nb_2O_5$), barium titanate ($BaTiO_3$), or strontium titanate ($SrTiO_3$).

When the gate insulation layer includes hafnium oxide, it can become crystallized in a subsequent heat treatment process. The gate insulation layer with crystallized hafnium oxide can cause the associated transistor in the in the memory cell to have decreased characteristics due to, for example, increased leakage current, infiltration of impurities contained in the gate electrode, and/or decreased threshold voltage.

In U.S. Pat. No. 6,642,131, a structure includes a layer of hafnium silicon oxide having a high dielectric constant, a lower barrier layer of hafnium silicon oxynitride, and an upper barrier layer of hafnium silicon oxynitride. A semiconductor device having this structure may be prone to having nitrogen exist at an interface between the gate insulation layer and the substrate, which may deteriorate its operating characteristics due to increased defect density and decreased carrier mobility.

SUMMARY OF THE INVENTION

Some embodiments of the present invention provide methods of forming a composite dielectric structure on a substrate. A first dielectric layer that includes metal and oxygen is formed on a substrate. A preliminary dielectric layer that includes silicon is formed on the first dielectric layer. A plasma nitrification treatment is performed on the preliminary dielectric layer to change it into a second dielectric layer. The composite dielectric structure includes the second dielectric layer and the first dielectric layer.

In some further embodiments of the present invention, the first dielectric layer may include at least one material selected from among a group consisting of hafnium oxide, zirconium oxide, lanthanum oxide, tantalum oxide, titanium oxide, strontium titanate, and barium strontium titanate. The preliminary dielectric layer may include silicon oxide, hafnium silicon oxide, or zirconium silicon oxide. When the preliminary dielectric layer includes silicon oxide, hafnium silicon oxide or zirconium silicon oxide, the second dielectric layer formed from the preliminary dielectric layer can include at least one material selected from the group consisting of silicon oxynitride, hafnium silicon oxynitride, and zirconium silicon oxynitride.

The first dielectric layer may be substantially thicker than the preliminary dielectric layer. An interface oxide layer may be formed on the substrate and the first dielectric layer may be formed on the interface oxide layer. The interface oxide layer may be formed by performing a thermal oxidation process or a plasma oxidation process on the substrate prior to forming the first dielectric layer. The interface oxide layer may have a thickness of about 3 Å to about 10 Å.

The plasma nitrification treatment may be performed with at least one of a nitrogen gas, an ammonia gas, a nitrogen monoxide gas, and a nitrous oxide gas. The plasma nitrification treatment may be performed at a temperature of about 400° C. to about 550° C.

The first dielectric layer, the preliminary dielectric layer and the second dielectric layer may be formed in-situ in a single chamber.

A third dielectric layer that includes metal and oxygen may be additionally formed on the preliminary dielectric layer prior to performing the plasma nitrification treatment to the preliminary dielectric layer. The third dielectric layer may include substantially the same material as the first dielectric layer.

A heat treatment may be performed to the first dielectric layer and the second dielectric layer to cure damage caused thereto by the plasma nitrification treatment and to substantially remove nitrogen remaining in the first dielectric layer. The heat treatment may be performed at a temperature of about 700° C. to about 900° C. The heat treatment may be performed with at least one of a nitrogen gas, an ammonia gas, a nitrogen monoxide gas, and a nitrous oxide gas.

Some other embodiments of the present invention provide methods of manufacturing a semiconductor device. A first dielectric layer that includes metal and oxygen is formed on a substrate. A preliminary dielectric layer that includes silicon is formed on the first dielectric layer. A plasma nitrification treatment is performed on the preliminary dielectric layer to change it into a second dielectric layer and form a composite dielectric structure that includes the first dielectric layer and the second dielectric layer. A conductive layer is formed on the composite dielectric structure.

In some further embodiments of the present invention, the conductive layer may be patterned to form a conductive pattern. The conductive layer pattern may form gate electrodes of metal oxide semiconductor transistors, control electrodes of a non-volatile memory device, and/or plate electrodes of capacitors.

A tunnel oxide layer may be formed on the substrate, a polysilicon layer may be formed on the tunnel oxide layer, with the tunnel oxide layer and the polysilicon layer between the substrate and at least a portion of the composite dielectric structure. The conductive layer may be patterned to form a conductive pattern which can form control electrodes of a non-volatile memory cell.

A storage electrode may be formed on the substrate, with the storage electrode between the substrate and at least a portion of the composite dielectric structure. The conductive layer may form a plate electrode of a capacitor.

Accordingly, in some embodiments of the present invention with the composite dielectric structure, the plasma nitrification treatment of the preliminary dielectric layer and the additional heat treatment may cause nitrogen in the first dielectric layer to become chemically combined with silicon contained in the preliminary dielectric layer. Therefore, nitrogen density at an interface between the substrate and the first dielectric layer may be decreased. Accordingly, the defect density of the semiconductor device may be decreased and the carrier mobility of the semiconductor device may be increased. Because the first dielectric structure has a dielectric constant higher than that of the second dielectric layer, the composite dielectric structure including the first and the second dielectric layers may have a thin equivalent oxide thickness (EOT) when the composite dielectric structure has a relatively thick physical thickness. As a result, the leakage current from the composite dielectric structure may be decreased and impurities in the composite dielectric structure may be reduced.

DETAILED DESCRIPTION OF EMBODIMENTS OF THE INVENTION

Figure 1:
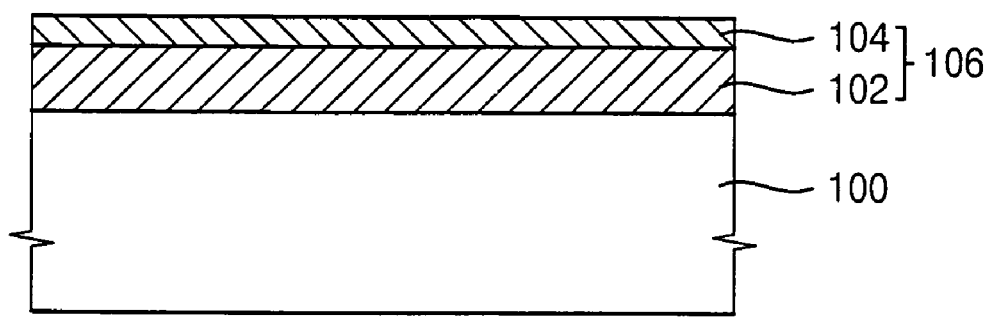
FIGS. 1 and 2 are cross-sectional views illustrating a method of forming a composite dielectric structure in accordance with an exemplary embodiment of the present invention.

While the invention is susceptible to various modifications and alternative forms, specific embodiments thereof are shown by way of example in the drawings and will be described in detail herein. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top" may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. The thickness of layers and regions are exaggerated for illustration and explanation. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
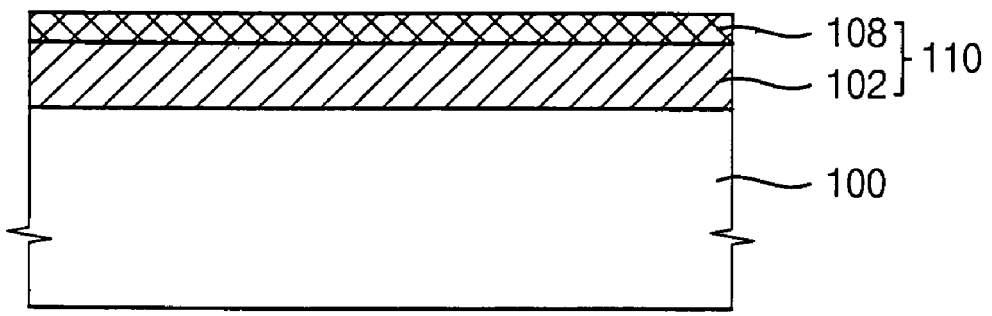

FIGS. 1 and 2 are cross-sectional views illustrating a method of forming a composite dielectric structure in accordance with an exemplary embodiment of the present invention.

FIG. 1 is a cross-sectional view illustrating a process for forming a preliminary composite dielectric structure 106 on a semiconductor substrate 100.

Referring to FIG. 1, a first dielectric layer 102 is formed on the semiconductor substrate 100, which may include a silicon wafer. The first dielectric layer 102 may include metal and oxygen. For example, the first dielectric layer 102 may be formed using a material having a high dielectric constant, such as hafnium oxide ($HfO_2$) or zirconium oxide ($ZrO_2$). The first dielectric layer 102 may have a thickness of about 5 Å to about 40 Å. The first dielectric layer 102 may be formed through processes that can include an atomic layer deposition (ALD) process, a chemical vapor deposition process (CVD), a plasma enhanced chemical vapor deposition (PECVD) process, and/or a physical vapor deposition (PVD) process. The first dielectric layer 102 may alternatively, or additionally, include a material having a high dielectric constant, such as lanthanum oxide ($La_2O_3$), tantalum oxide ($Ta_2O_5$), titanium oxide ($TiO_2$), strontium titanate ($SrTiO_3$), and/or barium strontium titanate (($Ba, Sr)TiO_3$).

A preliminary dielectric layer 104 is formed on the first dielectric layer 102. The preliminary dielectric layer may include silicon and have a thickness of about 5 Å to about 25 Å. The preliminary dielectric layer 104 may include silicon oxide ($SiO_2$), hafnium silicon oxide ($HfSi_xO_y$) or zirconium silicon oxide ($ZrSi_xO_y$). When the preliminary dielectric layer 104 includes hafnium silicon oxide or zirconium silicon oxide, the preliminary dielectric layer 104 may have a dielectric constant higher than that of silicon oxide. The preliminary dielectric layer 10.4 may be formed on the first dielectric layer 102 by an ALD process, a CVD process, a PECVD process and/or a PVD process. Thus, the first dielectric layer 102 and the preliminary dielectric layer 104 can formed on the semiconductor substrate 100 to define the preliminary composite dielectric structure 106.

The first dielectric layer 102 and the preliminary dielectric layer 104 may be formed in-situ using a single chamber, which may increase the efficiency with which the preliminary composite dielectric structure 106 may be formed. For example, the first dielectric layer 102 can be formed on the substrate 100 in a process chamber by an ALD process, a CVD process, and/or a PECVD process using a precursor that may include hafnium and a reaction gas including oxygen. The preliminary dielectric layer 104 can then be formed on the first dielectric layer 102 in the process chamber using a source gas including silicon, a precursor including oxygen, and a reaction gas including oxygen.

FIG. 2 is a cross-sectional view illustrating a process for forming a composite dielectric structure 110 from the preliminary composite dielectric structure 106 of FIG. 1.

Referring to FIG. 2, the preliminary dielectric layer 104 is changed into a second dielectric layer 108 by a plasma nitrification treatment. The preliminary dielectric layer 104 is nitrified to form therefrom the second dielectric layer 108 that includes nitrogen. Accordingly, the composite dielectric structure 110 includes the first and the second dielectric layers 102 and 108 on the substrate 100.

When the preliminary dielectric layer 104 includes hafnium silicon oxide, the second dielectric layer 108 may include hafnium silicon oxynitride ($HfSi_xO_yN_z$) after the plasma nitrification treatment. When the preliminary dielectric layer 104 includes silicon oxide, the second dielectric layer 108 may include silicon oxynitride (SiON) after treating the preliminary dielectric layer 104 using the plasma nitrification treatment.

Hafnium silicon oxynitride generally has a dielectric constant and a crystallization temperature that are substantially higher than those of hafnium silicon oxide. The second dielectric layer 108 can thereby have a relatively thin equivalent oxide thickness (EOT) when the second dielectric layer 108 has a relatively thick physical thickness. In addition, because the first dielectric layer 102 includes hafnium oxide with a high dielectric constant, an equivalent oxide thickness and a physical thickness of the composite dielectric structure 110 may be improved. Furthermore, the composite dielectric structure 110 may have an improved thermal stability when the second dielectric layer 108 includes amorphous hafnium silicon oxynitride which has a high crystallization temperature. Thus, leakage current from the composite dielectric structure 110 may be decreased and impurities in the composite dielectric structure 110 may be reduced.

Alternatively, the preliminary dielectric layer 104 may be changed into the second dielectric layer 108 by performing a heat treatment under a nitrogen atmosphere. The resulting second dielectric layer 108 includes nitrogen. However, when the preliminary dielectric layer 104 is changed into the second dielectric layer 108 by such heat treatment, excessive nitrogen may be diffused into a first interface between the substrate 100 and the first dielectric layer 102 due to thermal energy applied during the heat treatment. As explained above, nitrogen between the substrate 100 and the first dielectric layer 102 may cause increased defect density and decreased carrier mobility. Accordingly, changing the preliminary dielectric layer 104 into the second dielectric layer 108 by plasma nitrification treatment may provide improved device characteristics relative to carrying out the change through heat treatment alone.

In the plasma nitrification treatment, the preliminary dielectric layer 104 may be selectively nitrified because the plasma nitrification treatment is performed using ion energy. Nitrogen may be diffused into the first dielectric layer 102 in the plasma nitrification treatment. When the first dielectric layer 102 includes a material having the high dielectric constant, such as hafnium oxide, diffused nitrogen may migrate to chemically combine with silicon in the preliminary dielectric layer 104 because chemical bonds of hafnium and nitrogen are relatively unstable. Accordingly, the density of nitrogen at a second interface between the first dielectric layer 102 and the second dielectric layer 108 may increase, while the density of nitrogen at the first interface between the substrate 100 and the first dielectric layer 102 may decrease.

Because the bond between hafnium and nitrogen may be substantially unstable at a temperature above about 500° C., the plasma nitrification treatment may be performed at a temperature of about 400° C. to about 550° C. so that nitrogen in the first dielectric layer 102 can chemically combine with silicon in the preliminary dielectric layer 104. If the plasma nitrification treatment is carried out at an excessively high temperature, hafnium oxide included in the first dielectric layer 102 may become crystallized.

The plasma nitrification treatment may be performed in-situ using a nitrogen ($N_2$) gas, an ammonia ($NH_3$) gas, a nitrogen monoxide (NO) gas, a nitrous oxide ($N_2O$) gas or a mixture of two or more thereof, and using a carrier gas such as argon (Ar) gas and/or a helium (He) gas. The plasma nitrification treatment may be carried out using a remote plasma generated from a remote plasma generator connected to a process chamber. Alternatively, the plasma nitrification treatment may be performed using a plasma directly generated over the substrate 100 in a process chamber. For example, the remote plasma may be generated using a remote plasma generator that employs a microwave energy source or a radio frequency (RF) power source. Additionally, the plasma may be directly generated over the substrate 100 using a modified-magnetron type (MMT) plasma generator.

The first dielectric layer 102 can a thickness substantially thicker than that of the preliminary dielectric layer 104, so that nitrogen diffused into the preliminary composite dielectric structure 106 by the ion energy may move into the first interface between the substrate 100 and the first dielectric layer 102, and then may combine with silicon contained in the preliminary dielectric layer 104.

When the first dielectric layer 102 includes a material having a high dielectric constant such as zirconium oxide, lanthanum oxide, tantalum oxide, titanium oxide, strontium titanate and/or barium strontium titanate, nitrogen diffused into the preliminary composite dielectric structure 106 may also migrate into the first interface between the substrate 100 and the first dielectric layer 102 and combine with silicon in the preliminary dielectric layer 104. In particular, because zirconium oxide has characteristics similar to those of hafnium oxide, the first dielectric layer 102 can advantageously include zirconium oxide.

As described above, the process efficiency of the plasma nitrification treatment may be increased by carrying out the plasma nitrification treatment in-situ.

After the second dielectric layer 108 is formed through the plasma nitrification treatment, the composite dielectric structure 110 may be thermally treated to cure damage to the composite dielectric structure 110 that may be caused by the plasma nitrification treatment. In addition, a minute amount of nitrogen remaining in the first dielectric layer 102 may be removed by the heat treatment. In the plasma nitrification treatment, a minute amount of nitrogen may remain along the first interface between the substrate 100 and the first dielectric layer 102 rather than along the second interface between the first dielectric layer 102 and the second dielectric layer 108. By the heat treatment, the remaining nitrogen can move into the second interface and bond with silicon included in the second dielectric layer 108. Consequently, the nitrogen may not be easily diffused into the first interface. The heat treatment may be performed at a temperature of about 700° C. to about 900° C. using a nitrogen gas, an oxygen gas, a nitrogen monoxide gas, a nitrous oxide gas or a mixture of two or more thereof.

Figure 3:
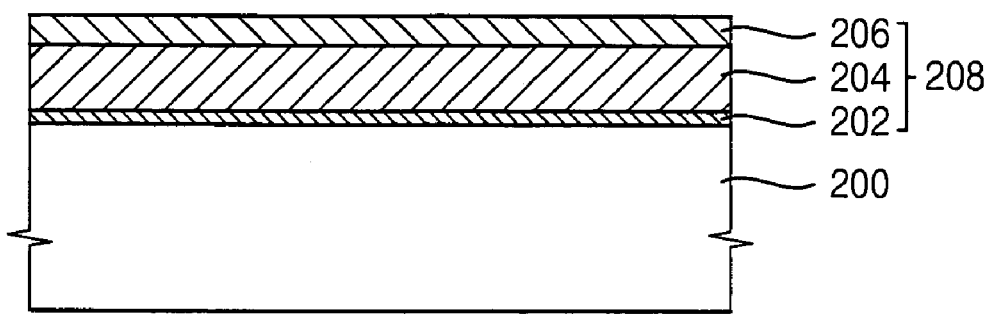
FIGS. 3 and 4 are cross-sectional views illustrating a method of forming a composite dielectric structure in accordance with another exemplary embodiment of the present invention.
Figure 4:
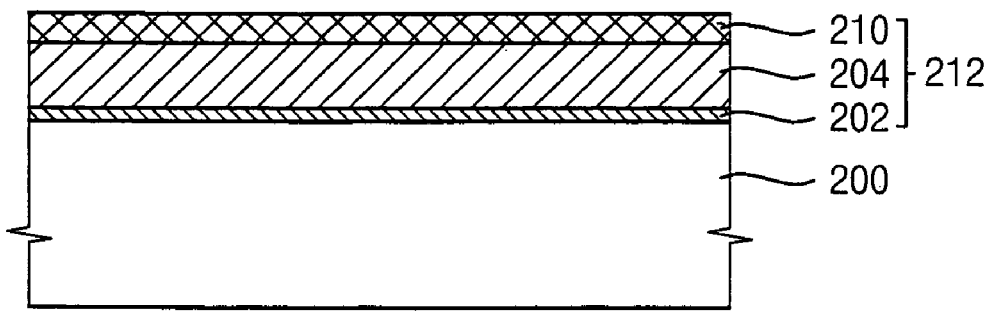

FIGS. 3 and 4 are cross-sectional views illustrating a method of forming a composite dielectric structure in accordance with an exemplary embodiment of the present invention.

FIG. 3 is a cross-sectional view illustrating a process for forming a preliminary dielectric structure 208 on a semiconductor substrate 200.

Referring to FIG. 3, an interface oxide layer 202 is formed on semiconductor substrate 200 such as a silicon wafer. The interface oxide layer 202 may have a thickness of about 2 Å to 10 Å from a thermal oxidation process or a plasma oxidation process. When the interface oxide layer 202 is formed on the substrate 200 by a thermal oxidation process or plasma oxidation process, the interface oxide layer 202 has a dielectric characteristic higher than that of a native oxide layer. In addition, the native oxide layer may not be formed on the substrate 200 when the interface oxide layer 202 is formed on the substrate 200.

A first dielectric layer 204 is formed on the interface oxide layer 202. The first dielectric layer 204 may be substantially identical to the first dielectric layer 102 described with reference to FIG. 1.

A preliminary dielectric layer 206 is formed on the first dielectric layer 204 to define the preliminary composite dielectric structure 208 on the substrate 200. The preliminary dielectric layer 206 also may be substantially identical to the preliminary dielectric layer 104 described with reference to FIG. 1.

FIG. 4 is a cross-sectional view illustrating a process for forming a composite dielectric structure 212 including the interface oxide layer 202.

Referring to FIG. 4, the preliminary dielectric layer 206 is changed into a second dielectric layer 210 by performing a plasma nitrification treatment of the preliminary dielectric layer 208. When the second dielectric layer 210 is thereby formed on the first dielectric layer 204, and the composite dielectric structure 212, including the interface oxide layer 202, the first dielectric layer 204 and the second dielectric layer 210, is formed on the substrate 200. The plasma nitrification treatment for forming the second dielectric layer 210 may be substantially identical to the above-described plasma nitrification treatment.

After the plasma nitrification treatment is performed, a minute amount of nitrogen may remain in the first dielectric layer 204. Through a subsequent heat treatment, remaining nitrogen partially migrates to a first interface between the first dielectric layer 204 and the second dielectric layer 210 where it is chemically combined with silicon in the second dielectric layer 210. The remaining nitrogen also partially moves to a second interface between the first dielectric layer 204 and the interface oxide layer 202 where it is chemically combined with silicon in the interface oxide layer 202. Accordingly, a thin film (not shown) including silicon oxynitride may be formed between the first dielectric layer 204 and the interface oxide layer 202 after the heat treatment. As a result, nitrogen remaining in the first dielectric layer 204 may hot become combined with silicon in the semiconductor substrate 200 through the heat treatment.

Figure 5:
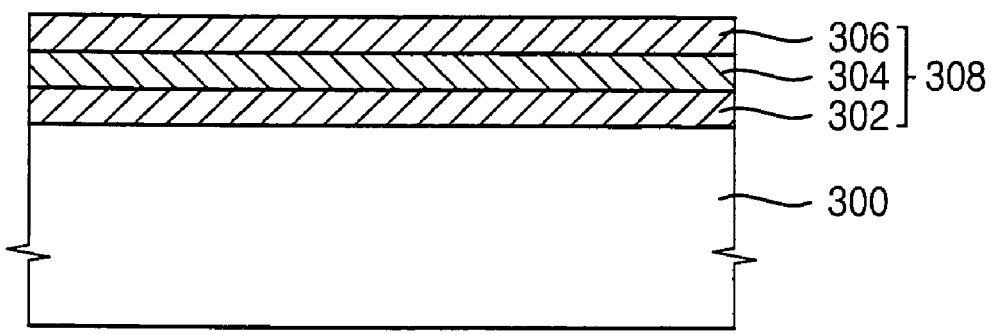
FIGS. 5 and 6 are cross-sectional views illustrating a method of forming a composite dielectric structure in accordance with yet another exemplary embodiment of the present invention.
Figure 6:
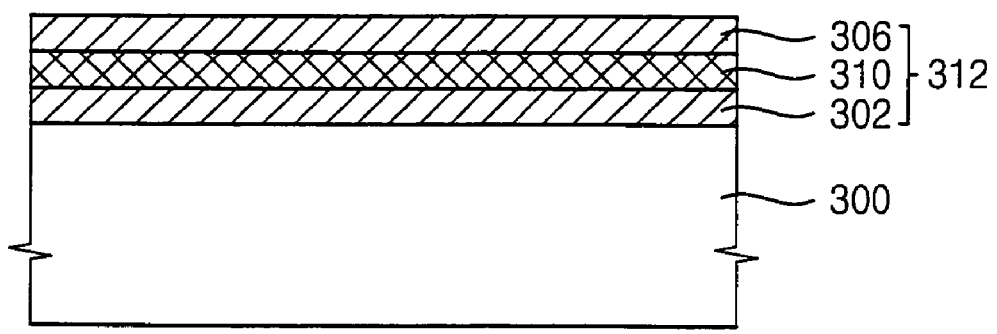

FIGS. 5 and 6 are cross-sectional views illustrating a method of forming a composite dielectric structure in accordance with another exemplary embodiment of the present invention.

FIG. 5 is a cross-sectional view illustrating a process for forming a preliminary composite dielectric structure 308 on a semiconductor substrate 300.

Referring to FIG. 5, the preliminary composite dielectric structure 308 is formed on the semiconductor substrate 300.

The preliminary composite dielectric structure 308 includes a first dielectric layer 302, a preliminary dielectric layer 304, and a third dielectric layer 306 sequentially formed on the semiconductor substrate 300. The preliminary dielectric layer 304 will be converted into a second dielectric layer 310.

Processes for forming the first dielectric layer 302 and the preliminary dielectric layer 304 may be substantially identical to those for forming the first dielectric layer 102 and the preliminary dielectric layer 104 described with reference to FIG. 1. The first dielectric layer 302 may have a thickness of about 5 Å to about 25 Å. Alternatively, the preliminary dielectric layer 304 may have a thickness substantially identical to that of the first dielectric layer 302, and the third dielectric layer 306 may also have a thickness substantially identical to that of the first dielectric layer 302.

The third dielectric layer 306 may be formed by a process substantially identical to that of the first dielectric layer 302. In particular, the third dielectric layer 306 may be formed on the preliminary dielectric layer 304 by an ALD process, a CVD process, a PECVD process and/or a PVD process. The third dielectric layer 306 may include a material having a high dielectric constant such as hafnium oxide, zirconium oxide, lanthanum oxide, tantalum oxide, titanium oxide, strontium titanate, and/or barium strontium titanate. The third dielectric layer 306 can advantageously include hafnium oxide or zirconium oxide.

FIG. 6 is a cross-sectional view illustrating a process for forming a composite dielectric structure 312 from the preliminary composite dielectric structure 308.

Referring to FIG. 6, the composite dielectric structure 312 may be formed by performing a plasma nitrification treatment of the preliminary composite dielectric structure 308. After the plasma nitrification treatment is selectively carried out on the preliminary dielectric layer 304, the preliminary dielectric layer 304 is changed into a second dielectric layer 310 including nitrogen, thereby forming the composite dielectric structure 312 on the substrate 300. The plasma treatment for forming the second dielectric layer 310 can be substantially identical to that for forming the second dielectric layer 108 described with reference to FIG. 2.

In the plasma nitrification process, the preliminary dielectric layer 304 may be selectively nitrified to form the second dielectric layer 310 because of an unstable bond between hafnium and nitrogen. Particularly, because nitrogen is combined with silicon in the preliminary dielectric layer 304 by ion energy, the preliminary dielectric layer 304 may be changed into the second dielectric layer 310 and include silicon oxynitride or hafnium silicon oxynitride.

An additional heat treatment may be performed to the composite dielectric structure 312 to cure damage that may occur to the composite dielectric structure 312 by the plasma nitrification treatment. A minute amount of nitrogen may remain in the first dielectric layer 302 and the third dielectric layer 306, and may be removed by the heat treatment.

In an embodiment of the present invention, an interface oxide layer (such as that shown in FIG. 3) may be formed on the substrate 300 before the first dielectric layer 302 is formed. The interface oxide layer may be formed by a thermal oxidation process or a plasma oxidation process. The interface oxide layer may prevent the remaining nitrogen in the first dielectric layer 302 from reacting with silicon in the substrate 300 during the heat treatment.

The above-described composite dielectric structures may be advantageously employed as a gate insulation layer and/or as a dielectric layer in a semiconductor device.

Figure 7:
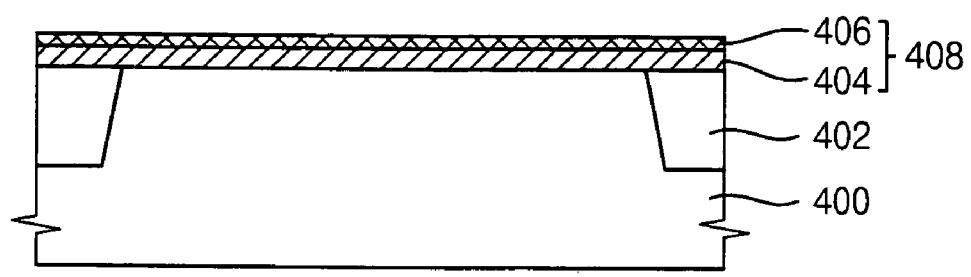
FIGS. 7 and 8 are cross-sectional views illustrating a method of manufacturing a semiconductor device in accordance with an exemplary embodiment of the present invention.
Figure 8:
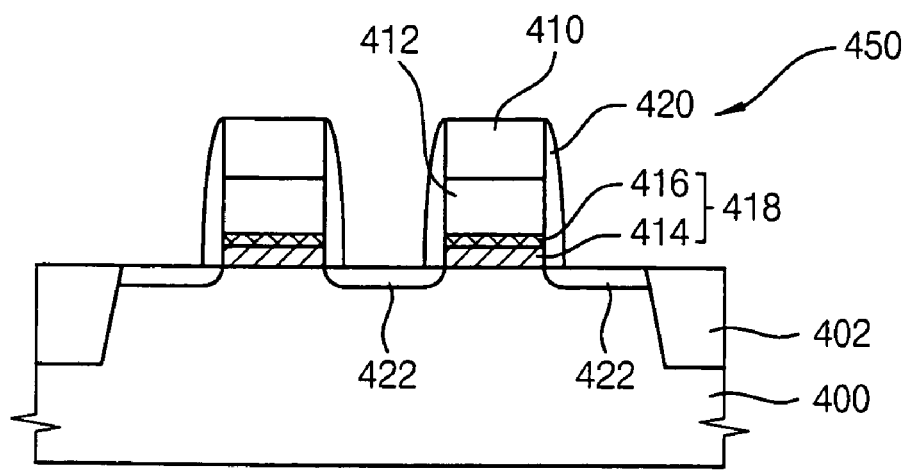

FIGS. 7 and 8 are cross-sectional views illustrating a method of manufacturing a semiconductor device in accordance with an exemplary embodiment of the present invention.

Referring to FIG. 7, an isolation layer 402 is formed on a semiconductor substrate 400 by an isolation process, such as a shallow trench isolation (STI) process or a local oxidation of silicon (LOCOS) process. The isolation layer 402 divides the semiconductor substrate 400 into an active region and a field region.

A first dielectric layer 404 and a second dielectric layer 406 are sequentially formed on the substrate 400 to form a composite dielectric structure 408. The first dielectric layer 404 may include a material having a high dielectric constant, and the second dielectric layer 406 may include amorphous silicon, oxygen and nitrogen. The second dielectric layer 406 may be formed using a material having a high crystallization temperature. For example, the first dielectric layer 404 may include hafnium oxide or zirconium oxide, and the second dielectric layer 406 may include hafnium silicon oxynitride or zirconium silicon oxynitride.

Referring to FIG. 8, a conductive layer (not shown) is formed on the composite dielectric structure 408. The conductive layer can include polysilicon doped with impurities, and the impurities may include boron or phosphorus. The conductive layer may be formed on the composite dielectric structure 408 by a LPCVD process and a doping process. In one embodiment of the present invention, a tungsten silicide layer may be additionally formed on the conductive layer.

A mask layer is formed on the conductive layer. The mask layer may be formed on the conductive layer by a CVD process using a nitride such as silicon nitride.

After a photoresist pattern is formed on the mask layer, the mask layer is etched using the photoresist pattern as an etching mask pattern to thereby form a mask pattern 410 on the conductive layer.

The conductive layer and the composite dielectric structure 408 are sequentially etched using the mask pattern as an etching mask pattern, thereby forming a gate structure on the substrate 400. The gate structure includes a mask pattern 410 and a conductive pattern 412.

The composite dielectric structure 408 is partially removed from the substrate 400 to form a composite dielectric pattern 418 on the substrate 400. A portion of the composite dielectric structure exposed between the gate structures is etched. The composite dielectric pattern 418 includes a first dielectric layer pattern 414 and a second dielectric layer pattern 416.

Source/drain regions 422 are formed in portions of the semiconductor substrate 400 exposed between the gate structures. The source/drain regions 422 are formed along surface portions of the substrate 400 by implanting impurities, using the gate structures as implantation masks.

A spacer 420 is formed on sidewalls of the gate structure to provide a metal oxide semiconductor (MOS) transistor 450 on the substrate 400. The conductive pattern 412 serves as a gate electrode, and the composite dielectric pattern 418 functions as a gate insulation layer of the MOS transistor 450.

The composite dielectric pattern 418 includes the first dielectric layer pattern 414 having the high dielectric constant, and the second dielectric layer pattern 416 having the high crystallization temperature. Thus, a leakage current from the composite dielectric pattern 418 may be greatly decreased and impurities in the composite dielectric pattern 418 may be considerably reduced. Additionally, a nitrogen density of an interface between the substrate 400 and the composite dielectric pattern 418 can be reduced, which can decrease defect density and improve carrier mobility.

Although the above-described MOS transistor 450 includes the composite dielectric pattern 418, it may include other composite dielectric patterns resulting from composite dielectric structures substantially identical to those described with reference to FIGS. 4 and 6.

Figure 9:
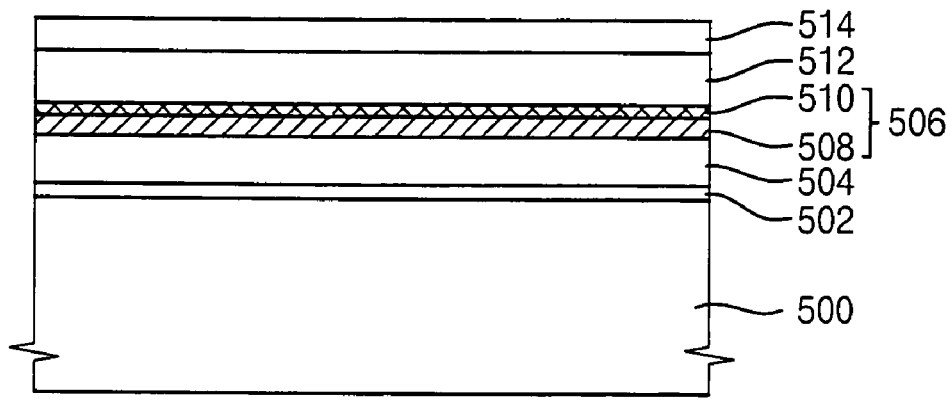
FIGS. 9 and 10 are cross-sectional views illustrating a method of forming a semiconductor device in accordance with another exemplary embodiment of the present invention.
Figure 10:
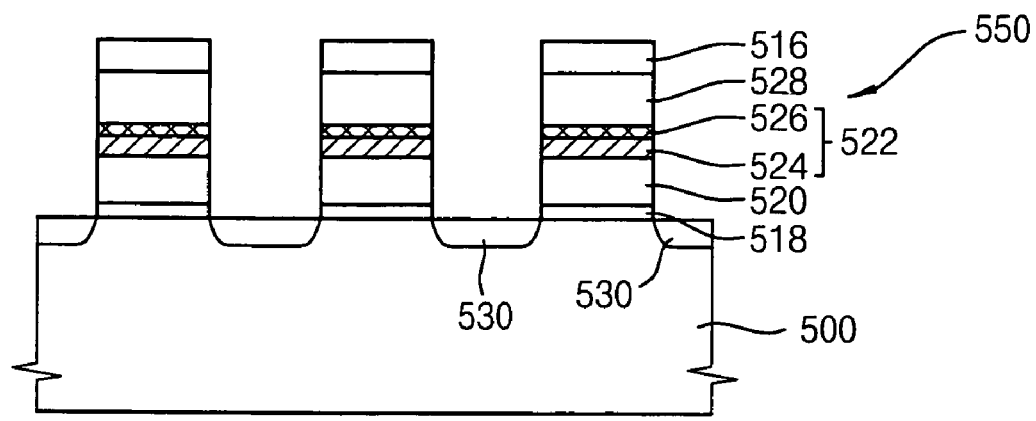

FIGS. 9 and 10 are cross-sectional views illustrating a method of forming a semiconductor device in accordance with another exemplary embodiment of the present invention.

Referring to FIG. 9, an isolation layer (not shown) is formed on a semiconductor substrate 500 by an isolation process such as by an STI process and/or a LOCOS process. The isolation layer defines an active region and a field region on the substrate 500.

A tunnel oxide layer 502, a first conductive layer 504, a composite dielectric structure 506, a second conductive layer 512, and a mask layer 514 are sequentially formed on the substrate 500.

The tunnel oxide layer 502 may be formed on the substrate 500 by a thermal oxidation process and/or a CVD process. The composite dielectric structure 506 includes a first dielectric layer 508 having a high dielectric constant and a second dielectric layer 510 having a high crystallization temperature. The second dielectric layer 510 may include amorphous silicon, oxygen and nitrogen. For example, the first dielectric layer 508 may be formed using hafnium oxide or zirconium oxide, and the second dielectric layer 510 can include hafnium silicon oxynitride or zirconium silicon oxynitride. Processes for forming the composite dielectric structure 506 may be substantially identical to those of the composite dielectric structure 110 described with reference to FIGS. 1 and 2.

The first and the second conductive layers 504 and 512 may include polysilicon doped with impurities. The first and the second conductive layers 504 and 512 may be formed using LPCVD processes and doping processes, respectively. In an embodiment of the present invention, a metal silicide layer such as a tungsten silicide layer may be formed on the second conductive layer 512. The mask layer 514 may include a nitride such as silicon nitride. The mask layer 514 may be formed on the second conductive layer 512 by a CVD process.

Referring to FIG. 10, after a photoresist pattern (not shown) is formed on the mask layer 514, the mask layer 514 is partially etched using the photoresist pattern as an etching mask pattern, thereby forming a mask pattern 516 on the second conductive layer 512.

The second conductive layer 512, the composite dielectric structure 506, the first conductive layer 504, and the tunnel oxide layer 502 are sequentially etched using the mask pattern 516 as an etching mask to thereby form a gate structure on the substrate 500. The gate structure includes a tunnel oxide layer pattern 518, a first conductive pattern 520, a composite dielectric pattern 522, and a second conductive pattern 528. The composite dielectric pattern 522 includes a first dielectric layer pattern 524 and a second dielectric layer pattern 526. The first conductive pattern 520 and the second conductive pattern 528 serve as a floating gate electrode and a control gate electrode, respectively.

Source/drain regions 530 are formed at surface portions of the semiconductor substrate 500 exposed between the gate structures, to form a portion of a non-volatile memory device 550 on the semiconductor substrate 500.

Because the composite dielectric pattern 522 includes the first dielectric layer pattern 524 having the high dielectric constant and the second dielectric layer pattern 526 having the high crystallization temperature, a leakage current from the composite dielectric pattern 522 between the first and the second conductive patterns 520 and 528 may be decreased and impurities in the composite dielectric pattern 522 may be reduced.

In some other embodiments of the present invention, the non-volatile semiconductor device 550 may include other composite dielectric patterns formed from composite dielectric structures that may be substantially identical to those described with reference to FIGS. 4 and 6.

Figure 11:
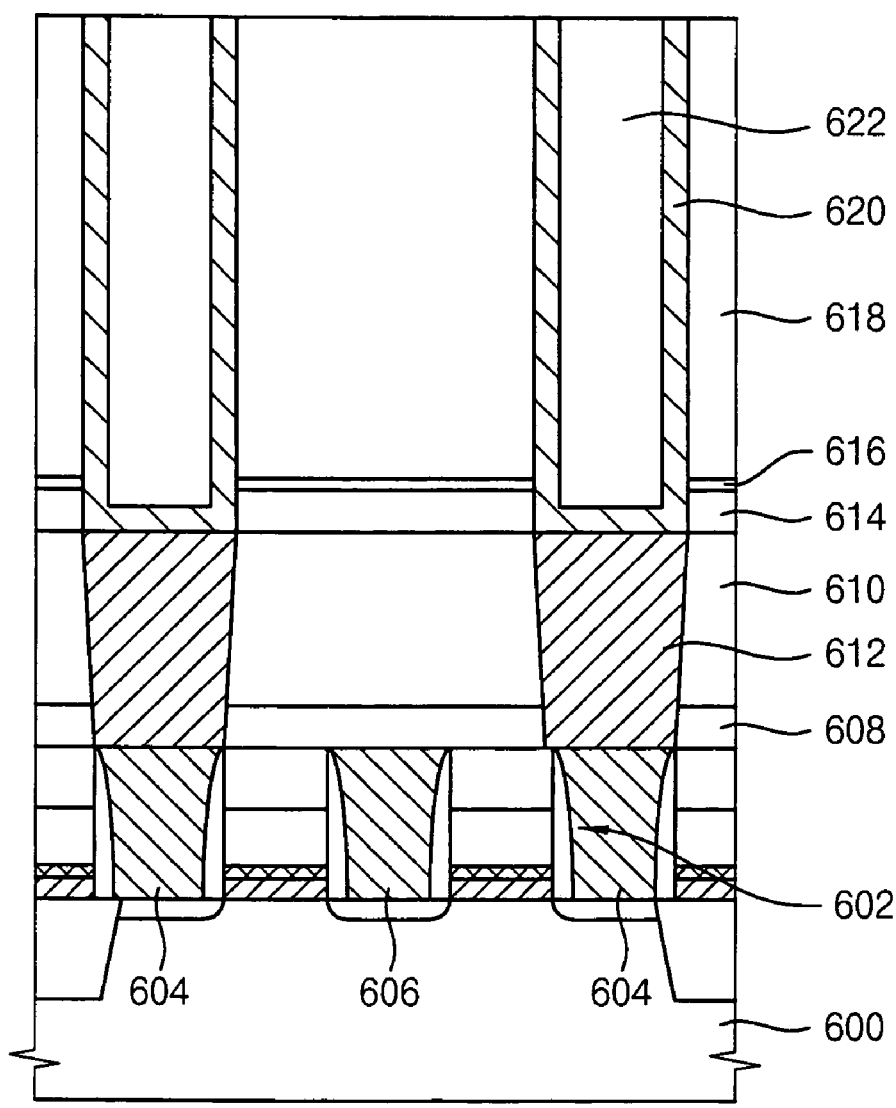
FIGS. 11 and 12 are cross-sectional views illustrating a method of forming a semiconductor device in accordance with still another exemplary embodiment of the present invention.
Figure 12:
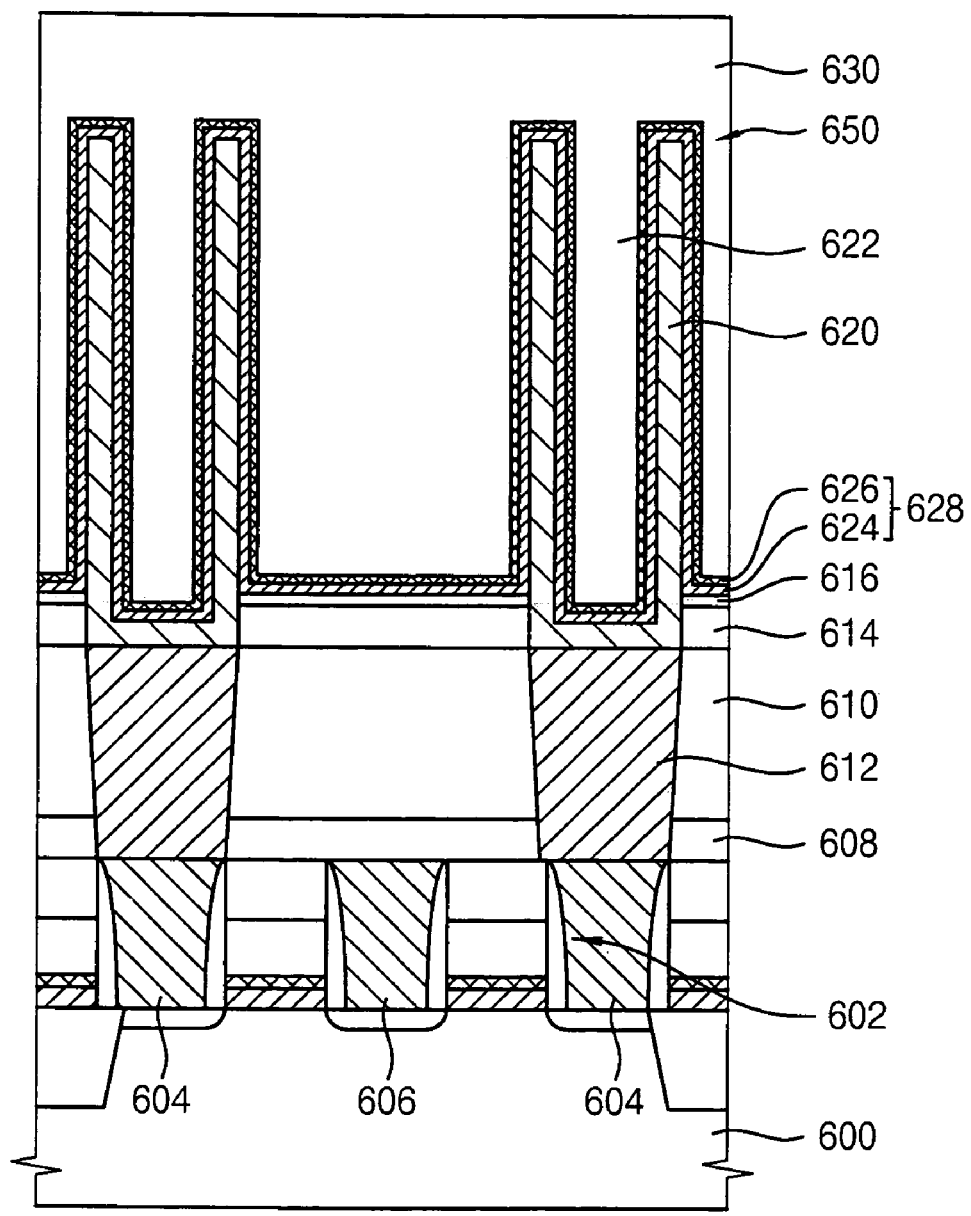

FIGS. 11 and 12 are cross-sectional views illustrating a method of forming a semiconductor device in accordance with another exemplary embodiment of the present invention.

Referring to FIG. 11, a lower structure including a MOS transistor 602 and a contact pad is formed on a semiconductor substrate 600. The MOS transistor 602 may be formed on the substrate 600 by processes substantially identical to the processes described with reference to FIGS. 7 and 8. Alternatively, the MOS transistor 602 may be formed by a conventional method.

A first insulating interlayer (not shown) is formed on the MOS transistor 602. The first insulating interlayer may include an oxide such as spin on glass (SOG), undoped silicate glass (USG), phosphor silicate glass (PSG), boro-phosphor silicate glass (BPSG), tetraethylorthosilicate (TEOS), plasma enhanced-TEOS (PE-TEOS), and/or high density plasma-CVD (HDP-CVD) oxide. Then, an upper portion of the first insulating interlayer is removed by a chemical mechanical polishing (CMP) process until the MOS transistor 602 is exposed.

After a first photoresist pattern (not shown) is formed on the first insulating interlayer, the first insulating interlayer is partially etched using the first photoresist pattern as an etching mask pattern, thereby forming first contact holes that expose source/drain regions of the MOS transistor 602.

A first pad 604 and a second pad 606 that fill up the first contact holes are formed on the exposed source/drain regions, respectively. The first pad 604 serves as a storage node contact pad, and the second pad 606 functions as a bit line contact pad.

A second insulating interlayer 608 is formed over the substrate 600 to cover the first pads 604 and the MOS transistor 602. The second insulating interlayer 608 electrically isolates the first pads 604 from a bit line. The second insulating interlayer 608 may be formed using an oxide such as SOG, USG, PSG, BPSG, TEOS, PE-TEOS, and/or HDP-CVD oxide.

The second pad 606 which contacts one of the source/drain regions is formed through the first insulating interlayer, and the bit line is formed on the second pad 606 and the second insulating interlayer 608.

A third insulating interlayer 610 is formed on the bit line and the second insulating interlayer 608. The third insulating interlayer 610 may include SOG, USG, PSG, BPSG, TEOS, PE-TEOS, and/or HDP-CVD oxide.

After a second photoresist pattern is formed on the third insulating interlayer 610, the third insulating interlayer 610 is partially etched using the second photoresist pattern as an second etching mask to thereby form a second contact hole that exposes the first pad 604. Third pad 612 contacting the first pad 604 is formed to fill up the second contact hole.

A fourth insulating interlayer 614, an etch stop layer 616 and a mold layer 618 are sequentially formed on the third insulating interlayer 610 and the third pads 612. The fourth insulating interlayer 614 may include SOG, USG, PSG, BPSG, TEOS, PE-TEOS, and/or HDP-CVD oxide. The etch stop layer 616 may be formed using a nitride such as a silicon nitride. The mold layer 618 may include an oxide such as TEOS, PE-TEOS or HDP-CVD oxide.

After a third photoresist pattern is formed on the mold layer 618, the mold layer 618, the etch stop layer 616 and the fourth insulating interlayer 614 are partially etched using the third photoresist pattern as an etching mask, thereby forming a storage node contact hole that partially exposes the third pad 612. Alternatively, a mask pattern (not shown) may be additionally formed on the mold layer 618, and then the mold layer 618, the etch stop layer 616 and the fourth insulating interlayer 614 are partially etched using the mask pattern as an etching mask to thereby form the storage node contact hole.

A storage electrode 620 is formed on the third pad 612 and a sidewall of the storage node contact hole. In particular, a first conductive layer (not shown), such as a polysilicon layer doped with impurities, is formed on the third pad 612, the sidewall of the storage node contact hole and the mold layer 618. A sacrificial layer 622 is then formed on the first conductive layer to fill up the storage node contact hole. Sequentially, the sacrificial layer 622 and the first conductive layer are partially removed by a CMP process until the mold layer 618 is exposed to thereby form the storage electrode 620.

Referring to FIG. 12, the mold layer 618 and the sacrificial layer 622 are removed by a dry etch process or a wet etch process. A composite dielectric structure 628 can be formed directly on the storage electrode 620. The composite dielectric structure 628 includes a first dielectric layer 624 which can be formed directly on the storage electrode 620 and a second dielectric layer 626 which can be formed directly on the first dielectric layer 624 opposite to the storage electrode 620. The first dielectric layer 624 may be formed using a material having a high dielectric constant, and the second dielectric layer 626 may be formed using a material having a high crystallization temperature. The second dielectric layer 626 includes silicon, oxygen and nitrogen. For example, the first dielectric layer 624 may include hafnium oxide or zirconium oxide, and the second dielectric layer 626 may include hafnium silicon oxynitride or zirconium silicon oxynitride. Processes for forming the composite dielectric structure 628 may be substantially identical to those of the composite dielectric structure 110 described with reference to FIGS. 1 and 2. Alternatively, the composite dielectric structure 628 may be formed using processes substantially identical to those of the composite dielectric structure 212 described with reference to FIG. 4. Therefore, a leakage current associated with the composite dielectric structure 628 may be decreased and also impurities in the composite dielectric structure 628 may be reduced.

A second conductive layer 630 is formed on the composite dielectric structure 628 to thereby form a capacitor 650 on the substrate 600. The second conductive layer 630 may include polysilicon doped with impurities. Alternatively, the second conductive layer 630 may include metal or conductive metal nitride.

Accordingly, in some embodiments of the present invention, a composite dielectric structure is formed from preliminary dielectric layer which is formed on a first dielectric layer having a high dielectric constant, and the structure is subjected to a plasma nitrification treatment and an additional heat treatment to change the preliminary dielectric layer including silicon to a second dielectric layer having nitrogen. Because the nitrogen is chemically combined with silicon in the preliminary dielectric layer without substantially bonding with silicon in the first dielectric layer, the preliminary dielectric layer may be selectively nitrified by the plasma nitrification treatment. Therefore, the nitrogen density may be decreased at an interface between the substrate and the first dielectric layer. Accordingly, the defect density of the semiconductor device may be decreased and the carrier mobility of it may increase. In addition, because the first dielectric structure has a dielectric constant higher than that of the second dielectric layer, the composite dielectric structure of the first and the second dielectric layers can have a thin equivalent oxide thickness (EOT) when the composite dielectric structure has a thick physical thickness. As a result, the leakage current from the composite dielectric structure may be considerably decreased and impurities in the composite dielectric structure may be considerably reduced.

Having thus described exemplary embodiments of the present invention, it is to be understood that the invention defined by the appended claims is not to be limited by particular details set forth in the above description, as many apparent variations thereof are possible without departing from the spirit thereof as hereinafter claimed.

What is claimed is:

1. A method of forming a composite dielectric structure on a substrate, the method comprising:

forming a first dielectric layer comprising substantially of metal and oxygen and free of oxygen on the substrate, the metal being substantially different from silicon and forming a relatively unstable chemical bond with nitrogen compared to silicon;

forming a preliminary dielectric layer that comprises silicon on the first dielectric layer wherein the first dielectric layer comprising substantially of the metal and oxygen and free of the nitrogen; and performing a plasma nitriding treatment to the preliminary dielectric layer to change the preliminary dielectric layer into a second dielectric layer, wherein the plasma nitriding treatment selectively nitrides the preliminary dielectric layer to form the composite dielectric structure comprising the second dielectric layer and the first dielectric layer, and having a non-uniform nitrogen density.

2. The method of claim 1, wherein the first dielectric layer comprises at least one material selected from the group consisting of hafnium oxide, zirconium oxide, lanthanum oxide, tantalum oxide, titanium oxide, strontium titanate, and barium strontium titanate.

3. The method of claim 2, wherein the first dielectric layer comprises hafnium oxide or zirconium oxide.

4. The method of claim 1, wherein the preliminary dielectric layer comprises at least one material selected from the group consisting of silicon oxide, hafnium silicon oxide, and zirconium silicon oxide.

5. The method of claim 4, wherein the second dielectric layer comprises at least one material selected from the group consisting of silicon oxynitride, hafnium silicon oxynitride, and zirconium silicon oxynitride.

6. The method of claim 1, wherein the first dielectric layer is substantially thicker than the preliminary dielectric layer.

7. The method of claim 1, further comprising forming an interface oxide layer between the substrate and the first dielectric layer.

8. The method of claim 7, wherein forming the interface oxide layer comprises performing a thermal oxidation process or a plasma oxidation process on the substrate to form the interface oxide layer on the substrate prior to forming the first dielectric layer.

9. The method of claim 7, wherein the interface oxide layer has a thickness of about 3 Å to about 10 Å.

10. The method of claim 1, wherein the plasma nitriding treatment is performed with at least one gas selected from the group consisting of a nitrogen gas, an ammonia gas, a nitrogen monoxide gas, and a nitrous oxide gas.

11. The method of claim 1, wherein the plasma nitriding treatment is performed at a temperature of about 400° C. to about 550° C.

12. The method of claim 1, wherein forming the first dielectric layer, forming the preliminary dielectric layer, and performing the plasma nitriding treatment to the preliminary dielectric layer to change the preliminary dielectric layer into the second dielectric layer are carried out in-situ in a single chamber.

13. The method of claim 1, further comprising forming a third dielectric layer comprising a metal and oxygen on the preliminary dielectric layer prior to performing the plasma nitriding treatment to the preliminary dielectric layer.

14. The method of claim 13, wherein the third dielectric layer comprises substantially the same material as the first dielectric layer.

15. The method of claim 1, further comprising performing a heat treatment to the first dielectric layer and the second dielectric layer to cure damage caused thereto by the plasma nitriding treatment and to substantially remove nitrogen remaining in the first dielectric layer.

16. The method of claim 15, wherein the heat treatment is performed at a temperature of about 700° C. to about 900° C.

17. The method of claim 15, wherein the heat treatment is performed with at least one gas selected from the group consisting of a nitrogen gas, an ammonia gas, a nitrogen monoxide gas, and a nitrous oxide gas.

18. The method of claim 1, wherein a nitrogen density of the first dielectric layer after said plasma nitriding treatment is substantially different from a nitrogen density of the second dielectric layer.

19. The method of claim 18, wherein the nitrogen density of the first dielectric layer after said plasma nitriding treatment is much less than the nitrogen density of the second dielectric layer.

20. A method of manufacturing a semiconductor device, comprising:
   forming on a substrate a first dielectric layer comprising substantially of a metal and oxygen and free of nitrogen, the metal being substantially different from silicon and forming a relatively unstable chemical bond with nitrogen compared to silicon;
   forming a preliminary dielectric layer comprising silicon on the first dielectric layer wherein the first dielectric layer comprising substantially of the metal and oxygen and free of the nitrogen;
   performing a plasma nitriding treatment to the preliminary dielectric layer to change the preliminary dielectric layer into a second dielectric layer, wherein the plasma nitriding treatment selectively nitrides the preliminary dielectric layer to form a composite dielectric structure comprising the first dielectric layer and the second dielectric layer and having a non-uniform nitrogen density; and
   forming a conductive layer on the composite dielectric structure.

21. The method of claim 20, further comprising patterning the conductive layer to form a conductive pattern, the conductive pattern forming gate electrodes of metal oxide semiconductor transistors.

22. The method of claim 20, further comprising:
   forming a tunnel oxide layer on the substrate;
   forming a polysilicon layer on the tunnel oxide layer, wherein the tunnel oxide layer and the polysilicon layer are between the substrate and at least a portion of the composite dielectric structure; and
   patterning the conductive layer to form a conductive pattern, the conductive pattern forming control electrodes of a non-volatile memory cell.

23. The method of claim 20, further comprising forming a storage electrode on the substrate, wherein the storage electrode is between the substrate and at least a portion of the composite dielectric structure, and the conductive layer forms a plate electrode of a capacitor.

24. The method of claim 20, wherein the first dielectric layer comprises at least one material selected from the group consisting of hafnium oxide, zirconium oxide, lanthanum oxide, tantalum oxide, titanium oxide, strontium titanate, and barium strontium titanate.

25. The method of claim 20, wherein the preliminary dielectric layer comprises at least one material selected from the group consisting of silicon oxide, hafnium silicon oxide, and zirconium silicon oxide.

26. The method of claim 20, further comprising forming an interface oxide layer between the substrate and the first dielectric layer.

27. The method of claim 20, wherein the plasma nitriding treatment is performed with at least one gas selected from the group consisting of a nitrogen gas, an ammonia gas, a nitrogen monoxide gas, and a nitrous oxide gas.

28. The method of claim 20, wherein forming the first dielectric layer, forming the preliminary dielectric layer, and forming the composite dielectric structure are carried out in-situ in a single chamber.

29. The method of claim 20, further comprising forming a third dielectric layer on the preliminary dielectric layer prior to performing the plasma nitriding treatment to the preliminary dielectric layer.

30. The method of claim 29, wherein the third dielectric layer comprises substantially the same material as the first dielectric layer.

31. The method of claim 20, further comprising performing a heat treatment to the first dielectric layer and the second dielectric layer to cure damage caused thereto by the plasma nitriding treatment and to substantially remove nitrogen remaining in the first dielectric layer.

* * * * *

UNITED STATES PATENT AND TRADEMARK OFFICE
CERTIFICATE OF CORRECTION

PATENT NO.       : 7,507,652 B2
APPLICATION NO.  : 11/176715
DATED            : March 24, 2009
INVENTOR(S)      : Cho et al.

It is certified that error appears in the above-identified patent and that said Letters Patent is hereby corrected as shown below:

Column 14, Claim 1, Line 21:
Please correct "metal and oxygen and free of oxygen"
  to read -- metal and oxygen and free of nitrogen --

Signed and Sealed this

Twenty-sixth Day of May, 2009

JOHN DOLL
*Acting Director of the United States Patent and Trademark Office*